(12) United States Patent
Lutich

(10) Patent No.: US 10,235,492 B2
(45) Date of Patent: Mar. 19, 2019

(54) MATCHING IC DESIGN PATTERNS USING WEIGHTED XOR DENSITY

(71) Applicant: GLOBALFOUNDRIES INC., Grand Cayman (KY)

(72) Inventor: Andrey Lutich, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/617,403

(22) Filed: Jun. 8, 2017

(65) Prior Publication Data

US 2018/0357353 A1 Dec. 13, 2018

(51) Int. Cl.
*G06F 17/50* (2006.01)

(52) U.S. Cl.
CPC ............................... *G06F 17/5081* (2013.01)

(58) Field of Classification Search
CPC .................................................. G06F 17/5081
See application file for complete search history.

(56) References Cited

U.S. PATENT DOCUMENTS

| 7,679,055 | B2 * | 3/2010 | Sutani | G06T 7/001 |
| | | | | 250/306 |
| 7,888,638 | B2 * | 2/2011 | Miyamoto | G01N 23/2251 |
| | | | | 250/307 |
| 8,326,018 | B2 | 12/2012 | Simmons et al. | |
| 8,402,397 | B2 | 3/2013 | Robles et al. | |
| 8,751,976 | B2 * | 6/2014 | Tsai | G06F 17/5081 |
| | | | | 716/100 |
| 8,769,474 | B1 | 7/2014 | Gennari et al. | |
| 8,832,621 | B1 | 9/2014 | Gennari et al. | |
| 2015/0277237 | A1 * | 10/2015 | Sutani | B82Y 40/00 |
| | | | | 355/53 |

* cited by examiner

*Primary Examiner* — Vuthe Siek
(74) *Attorney, Agent, or Firm* — Gibb & Riley, LLC; David A. Cain, Esq.

(57) ABSTRACT

A known pattern area (of known shapes) is aligned with a first area of an IC design (by overlaying and centering the known pattern area on the first area). The first area is compared to the known pattern area to identify dissimilarities between shapes in the first area and the known shapes in the known pattern area as unweighted shapes. The unweighted shapes are weighted (based on the location of the unweighted shapes relative to a weighting zone pattern) to produce weighted shapes; and a dissimilarity measure between the first area and the known pattern area is calculated by summing the weighted shapes. A determination of whether the first area matches the known pattern area is made (based on whether the dissimilarity measure exceeds a threshold) and the same is output.

20 Claims, 5 Drawing Sheets

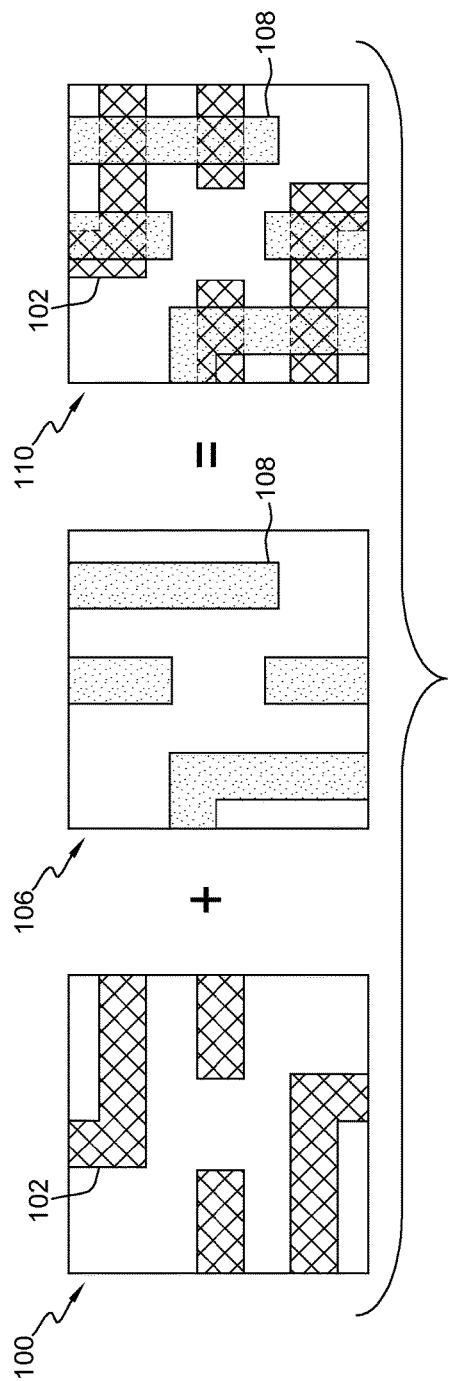
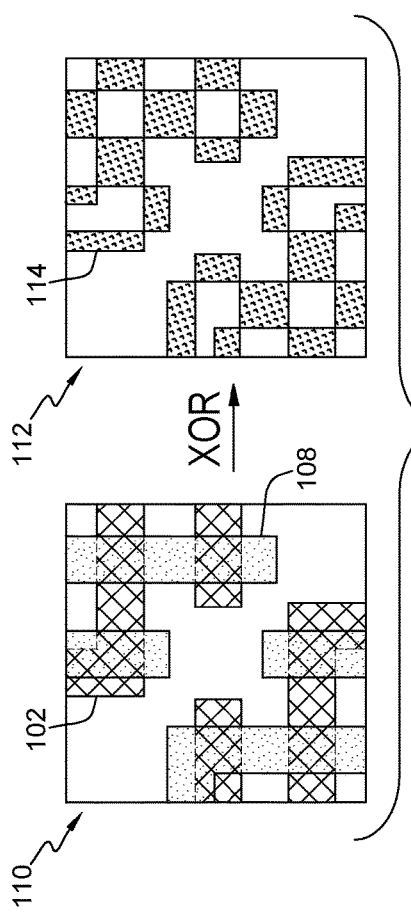
FIG. 1A
FIG. 1B

MATCHING IC DESIGN PATTERNS USING WEIGHTED XOR DENSITY

BACKGROUND

Field of the Invention

The present disclosure relates to evaluating circuit designs, and more specifically, to methods and systems that perform pattern recognition in circuit designs.

Description of Related Art

Because of the scale and complexity of semiconductor designs, it can be challenging to identify design issues. Pattern matching is one method to find and identify design weak points in semiconductor integrated circuit (IC) designs; however, such pattern matching processes are not necessarily sensitive to placement of individual edges, but rather depend on the overall pattern configuration.

A typical scenario, when defect searching is used in semiconductor manufacturing, is a case when optical/photoresist/etch models are not capable of predicting patterning failures by defect inspection/failure analysis alone (patterns known as weak spots). Additionally, conventional pattern matching struggles to find the weak spot pattern that most closely matches the IC design shapes.

SUMMARY

Various methods herein receive an integrated circuit (IC) design into a computerized device. With this, such methods automatically select a first area (that has first shapes) of the IC design that is to be pattern matched, and automatically align a known pattern area (of known shapes) with the first shapes of the first area (by overlaying and centering the known pattern area on the first area), using the computerized device. The first shapes represent device elements of devices in the IC design, and the known shapes represent known shapes maintained in a library of shapes.

These methods automatically compare the first area to the known pattern area, while the first area is overlaid on the known pattern area, to identify dissimilarities between the first shapes in the first area and the known shapes in the known pattern area, again using the computerized device. These dissimilarities are polygons that are referred to herein as unweighted shapes. The unweighted shapes are maintained in a temporary working layer referred to as a pattern difference area.

The process of comparing the first area to the known pattern area involves performing an exclusive or (XOR) comparison of aligned portions of the first area and the known pattern area to determine if the aligned portions are different from one another. In other words, this comparison identifies locations where portions of the first shapes in the first area and portions of the known shapes in the known pattern area are present, but do not overlap one another.

Additionally, the methods herein allow users to select from among different weighting zone patterns, automatically align the pattern difference area to the selected weighting zone pattern (e.g., by overlaying), and automatically weight the unweighted shapes (based on the location of the unweighted shapes relative to the weighting zone pattern aligned with the pattern difference area) to produce weighted shapes, using the computerized device. The known design area, the pattern difference area, and the weighting zone pattern are approximately the same size. More specifically, these methods weight the unweighted shapes by multiplying an area measure of each polygon portion of the unweighted shapes that are within a corresponding zone of the weighting zone pattern by a weighting factor of the corresponding zone.

Further, such methods automatically calculate a dissimilarity measure between the first area and the known pattern area by summing the weighted shapes in the pattern difference area, using the computerized device. Thus, these methods can automatically determine a match factor of how much, or whether, the first area matches the known pattern area (e.g., based on the magnitude of the dissimilarity measure, and/or whether the dissimilarity measure exceeds a threshold, etc.) using the computerized device; and then automatically output the match factor.

Systems herein include (among other components) at least one processor, at least one input/output connected to the processor, etc. The input/output receives an integrated circuit (IC) design. The processor automatically selects a first area of the IC design that has first shapes. The first shapes represent device elements of devices in the IC design and the known shapes represent known shapes in a library of shapes. The processor automatically aligns a known pattern area of known shapes with the first shapes of the first area by overlaying and centering the known pattern area on the first area.

The processor automatically compares the first area to the known pattern area, while the first area is overlaid on the known pattern area, to identify dissimilarities, between the first shapes in the first area and the known shapes in the known pattern area, as unweighted shapes. The unweighted shapes are maintained in temporary working layer referred to as a pattern difference area. More specifically, the processor compares the first area to the known pattern area by performing an exclusive or (XOR) comparison of aligned portions of the first area and the known pattern area to determine if the aligned portions are different from one another. Stated differently, the processor compares the first area to the known pattern area by identifying locations where portions of the first shapes in the first area and portions of the known shapes in the known pattern area are present, but do not overlap one another.

The processor automatically (or the user manually) selects from among different weighting zone patterns to select a weighting zone pattern. The processor automatically aligns the pattern difference area to the weighting zone pattern (by overlaying and centering the weighting zone pattern on the pattern difference area). The processor thus automatically weights the unweighted shapes, based on the location of the unweighted shapes relative to the weighting zone pattern aligned with the pattern difference area, to produce weighted shapes in the pattern difference area. In more detail, the processor weights the unweighted shapes by multiplying an area measure of each portion of the unweighted shapes that are within a corresponding zone of the weighting zone pattern by a weighting factor of the corresponding zone.

Further, the processor automatically calculates a dissimilarity measure between the first area and the known pattern area by summing the weighted shapes in the pattern difference area. Also, the processor automatically determines a match factor of how much, or whether, the first area matches the known pattern area (e.g., based on the magnitude of the dissimilarity measure, and/or whether the dissimilarity measure exceeds a threshold); and the input/output automatically outputs the match factor.

BRIEF DESCRIPTION OF THE DRAWINGS

The embodiments herein will be better understood from the following detailed description with reference to the drawings, which are not necessarily drawn to scale and in which:

FIGS. 1A-1D are schematic diagrams illustrating IC design shapes being compared to known shapes;

DETAILED DESCRIPTION

Figure 1C:
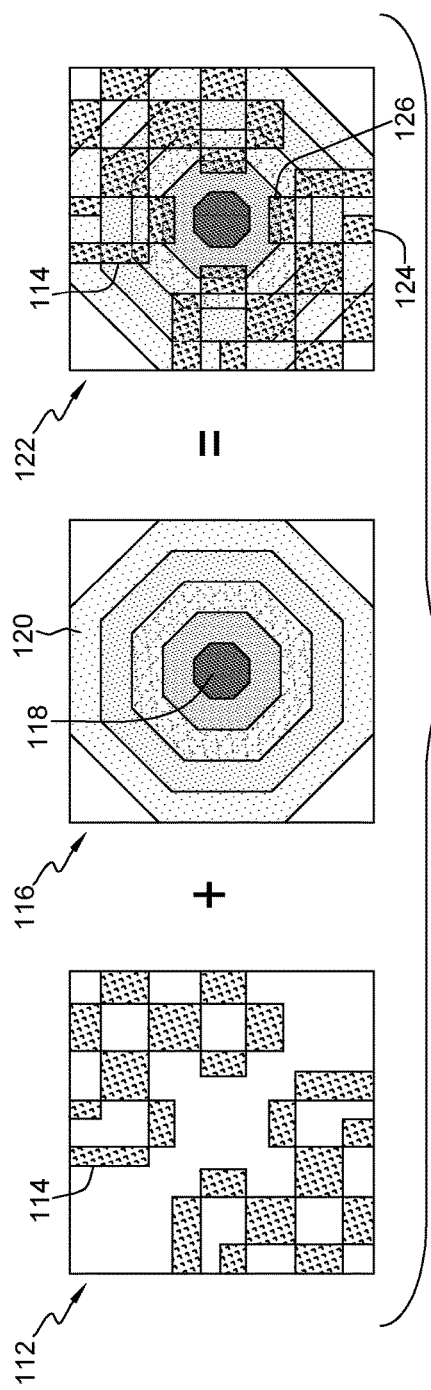

The methods and system herein relate to integrated circuit (IC) physical design pattern analytics and search/matching. For example, these systems and methods can be used to find patterns most similar to a reference pattern from the patterning and/or optical proximity correction (OPC) standpoint.

More specifically, the methods and systems herein capture pattern difference aspects that have direct implications to the processing, by considering an area of differences (XOR area) as a basis for estimating dissimilarity between patterns, rather than deviation of individual edges or hand-crafted pattern representations. The methods and systems herein can also give larger weight to differences between patterns located closer to the reference weak point location, relative to those on the periphery, to account for typically higher impact of the deltas at the pattern center.

With the processing herein, the dissimilarity is found by aligning design patterns with respect to their centers; an XOR operation is executed to generate a dissimilarity layer; polygons on the dissimilarity layer are split and sorted with respect to the zones of importance; (the importance zones reflect distribution of weights across the pattern area); and the dissimilarity is calculated as a sum of polygon areas on the dissimilarity layer within each zone multiplied by the weight of the corresponding zone.

Therefore, as contrasted to matching processes that are not necessarily sensitive to placement of individual edges, and that are based on the criteria derived from the entire pattern; the methods and systems herein define and search for patterns with emphasis on patterning, rather than on pure geometry. This delivers results that are easy to interpret by patterning experts and, therefore, can efficiently promote patterning development.

Referring now to the drawings, FIG. 1A-1D illustrate that methods herein process data of an integrated circuit (IC) design received into a computerized device. Further, such methods automatically select an area of interest (e.g., an area that may have a weak pattern of shapes) referred to as a first area 100 of the IC design, that has first shapes 102. With this, such methods automatically align a known pattern area 106 (of known shapes 108) with the first shapes 102 of the first area 100 (by overlaying and centering the known pattern area 106 on the first area 100 to create a first overlay 110), using the computerized device. The first shapes 102 represent device elements of devices in the IC design, and the known shapes 108 represent known shapes 108 in a library of shapes; and the known shapes 108 represent a known failure mechanism that the IC design should avoid or minimize.

As shown in FIG. 1B, these methods automatically compare the first area 100 to the known pattern area 106, while the first area 100 is overlaid 110 on the known pattern area 106, to identify dissimilarities 114 between the first shapes 102 in the first area 100 and the known shapes 108 in the known pattern area 106, again using the computerized device. These dissimilarities 114 are polygons that are sometimes referred to herein as unweighted shapes 114. The unweighted shapes 114 are maintained in temporary working layer referred to as a pattern difference area 112.

The process of comparing the first area 100 to the known pattern area 106 involves performing an exclusive or (XOR) comparison of aligned portions of the first area 100 and the known pattern area 106 to determine if the aligned portions are different from one another. In other words, this comparison identifies locations 114 where portions of the first shapes 102 in the first area 100 and portions of the known shapes 108 in the known pattern area 106 are present, but do not overlap one another.

As shown in FIG. 1C, these methods automatically align the pattern difference area 112 to a weighting zone pattern 116 (e.g., by overlaying in a second overlay 122). The weighting zone pattern 116 includes relatively higher weights 118 in the center, and relatively lower weights 120 as the distance increases from the center. Therefore, unweighted shape 124 will receive a smaller amount of weighting (it will be multiplied by a smaller number) relative to the unweighted shape 126 that will receive a higher amount of weighting. In this way, the methods herein give larger weight to differences between patterns located closer to the reference weak point location (e.g., which is the center of the first area) relative to those on the periphery, to account for typically higher impact of the deltas at the pattern center.

Figure 1D:
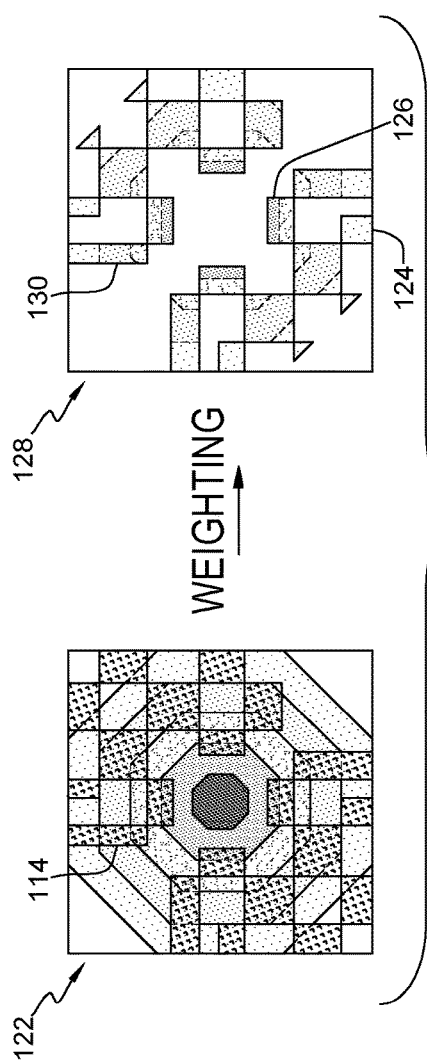

FIG. 1D illustrates the weighting process, where methods herein automatically weight the unweighted shapes 114 (based on the location of the unweighted shapes 114, relative to the weighting zone pattern 116 aligned with the pattern difference area 112 in the second overlay 122) to produce weighted shapes 130 in a weighted area 128, using the computerized device. More specifically, these methods weight the unweighted shapes 114 by multiplying an area measure of each polygon portion of the unweighted shapes 114 that are within a corresponding zone of the weighting zone pattern 116 by a weighting factor (e.g., a percentage, a fraction, etc.) of the corresponding zone. Therefore, because all of unweighted shape 124 lies in the outermost weighting zone 120, all of the square area of unweighted shape 124 will be multiplied by the weighting factor of weighting zone 120. To the contrary, different halves of unweighted shape 126 lie in different weighting zones. Therefore, half the square area of unweighted shape 126 will be multiplied by the weighting factor of one weighting zone; while the other half the square area of unweighted shape 126 will be multiplied by a different weighting factor of a different weighting zone. A similar situation occurs where identification numeral 114 points, and the square area of that shape is split into 3 potentially unequal parts, each of which receives a different weighting.

As shown in FIGS. 1A-1D, the known design area, the pattern difference area 112, and the weighting zone pattern 116 are approximately the same size. These methods automatically calculate a dissimilarity measure between the first area 100 and the known pattern area 106 by summing the weighted shapes in the weighted area 128, using the computerized device. Thus, these methods can automatically determine a match factor of how much, or whether, the first area 100 matches the known pattern area 106 (based on the magnitude of the dissimilarity measure, and/or whether the dissimilarity measure exceeds a threshold) using the computerized device; and then the match factor is automatically output.

Figure 2A:
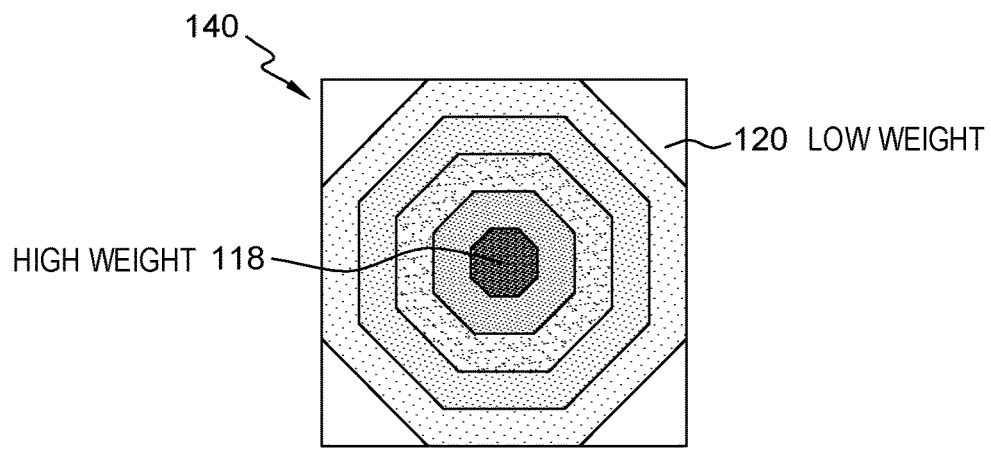
FIGS. 2A-2C are schematic diagrams illustrating weighting zones.
Figure 2B:
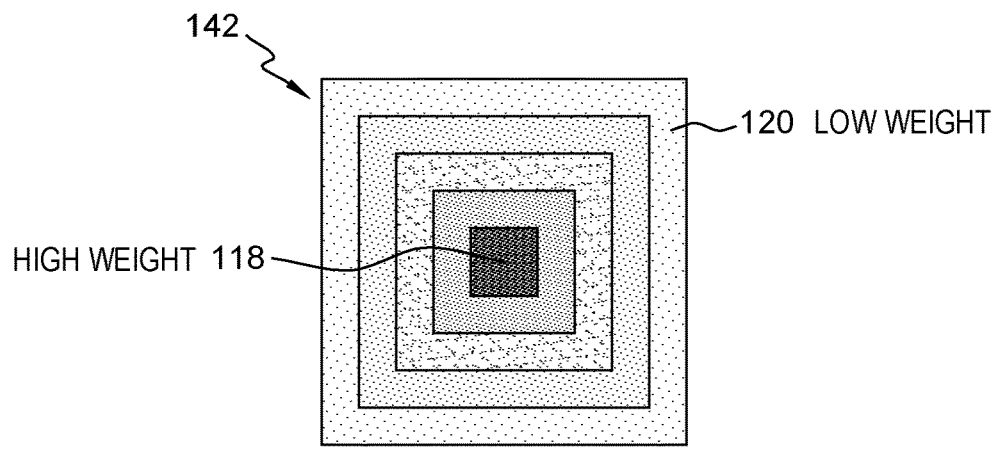
Figure 2C:
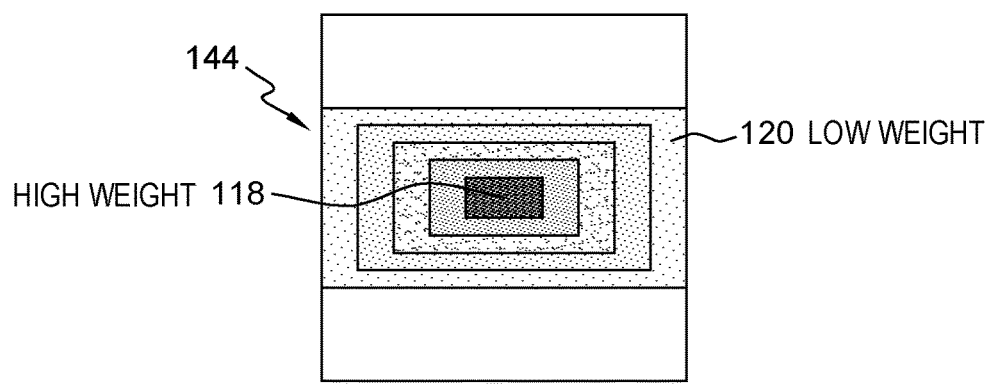

FIGS. 2A-2C illustrate that the methods herein allow users to select from among different weighting zone patterns (sometimes also referred to as importance zone maps (IZM)). For example, the user can be provided the option to select between (or the selection can be done automatically) a hexagonal weighting zone pattern 140 (FIG. 2A), square weighting zone pattern 142 (FIG. 2B), rectangular weighting zone pattern 144 (FIG. 2C), etc. Providing user selection of such weighting zone patterns allows flexible and continuous tuning of what is important for a pattern. Further, the weighting zone patterns can be of any shape and have any number of zones to favor capturing particular features of the pattern; and the weights of the zones can be tuned by the users, independently of their sizes.

Note that all such weighting zone patterns 140-144 include relatively higher weights 118 in the center, and relatively lower weights 120 as the distance increases from the center. The methods and systems herein can automatically create weighting zone patterns 140-144 presented to the user for selection, using probability distributions relating to different failure mechanisms. More specifically, the change in weighting percentage from one zone to the next is adjusted based upon the probability distribution of the specific failure mechanism of interest (e.g., the probability of failure of the shapes 108 represented by the known design area 106). The probability distribution of failure is obtained from empirical testing of fabricated devices. In other words, some failure probability distributions call for a very steep decay of weighting values when moving from the center 118 of the weighting in zone pattern, while other probability distributions call for less steep (more gradual) decay in the weighting values.

Therefore, some weighting zone patterns utilize small (e.g., 3%, 5%, 10%, etc.) differences between the weights in each adjacent weighting zone (the five zones from 118 to 120); while other weighting zone patterns (which may or may not have the same shape) utilize larger (e.g., 15%, 20%, 25%, etc.) differences between the weights in each adjacent weighting zone; and, again, the magnitude of the steps or changes in the weighting percentage between adjacent weighting zones is based upon the probability distribution of the failure mechanism.

Figure 3:
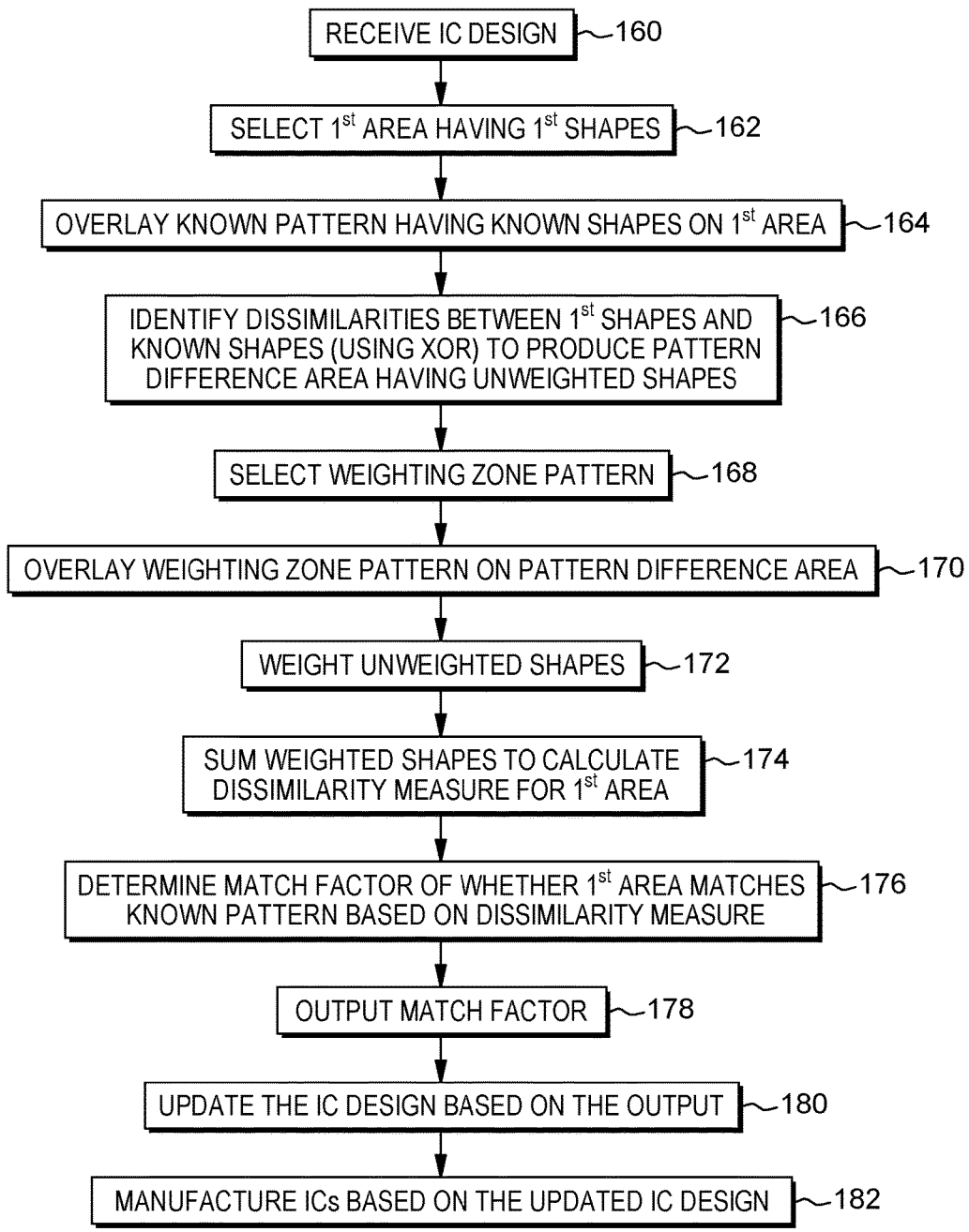
FIG. 3 is a flow diagram illustrating embodiments herein.

As shown in item 160 in the flowchart in FIG. 3, various methods herein receive an integrated circuit (IC) design into a computerized device. Further, in item 162, such methods automatically select a first area (that has first shapes) of the IC design, and automatically align a known pattern area (of known shapes) with the first shapes of the first area (by overlaying and centering the known pattern area on the first area) in item 164, using the computerized device. The first shapes represent device elements of devices in the IC design and the known shapes represent known shapes in a library of shapes.

In item 166, these methods automatically compare the first area to the known pattern area, while the first area is overlaid on the known pattern area, to identify dissimilarities between the first shapes in the first area and the known shapes in the known pattern area, again using the computerized device. These dissimilarities are polygons that are referred to herein as unweighted shapes. The unweighted shapes are maintained in a pattern difference area.

The process of comparing the first area to the known pattern area in item 166 involves performing an exclusive or (XOR) comparison of aligned portions of the first area and the known pattern area to determine if the aligned portions are different from one another. In other words, this comparison in item 166 identifies locations where portions of the first shapes in the first area and portions of the known shapes in the known pattern area are present, but do not overlap one another.

Additionally, the methods herein automatically (or allow users to) select from among different weighting zone patterns in item 168. The known design area, the pattern difference area, and the weighting zone pattern are approximately the same size. With this, in item 170, these methods automatically align the pattern difference area to the selected weighting zone pattern (e.g., by overlaying).

Thus, in item 172, such methods can automatically weight the unweighted shapes (based on the location of the unweighted shapes relative to the weighting zone pattern aligned with the pattern difference area) to produce weighted shapes, using the computerized device. More specifically, in item 172, these methods weight the unweighted shapes by multiplying an area measure of each polygon portion of the unweighted shapes that are within a corresponding zone of the weighting zone pattern by a weighting factor of the corresponding zone.

Further, in item 174, such methods automatically calculate a dissimilarity measure between the first area and the known pattern area by summing the weighted shapes in the pattern difference area, using the computerized device. Thus, in item 176, these methods can automatically determine a match factor of how much, or whether, the first area matches the known pattern area (based on the magnitude of the dissimilarity measure, and/or whether the dissimilarity measure exceeds a threshold) using the computerized device; and then, in item 178, automatically output the match factor for the first area.

Thus, the IC design can be automatically or manually updated (i.e., amended or adjusted) based on the output at item 180 in order to avoid or at least minimize the occurrence of such potential failure patterns, in item 182. The updated IC design can be stored in memory and IC chips can subsequently be manufactured based on that updated IC design, in item 182, in order to minimize device failures.

Figure 4:
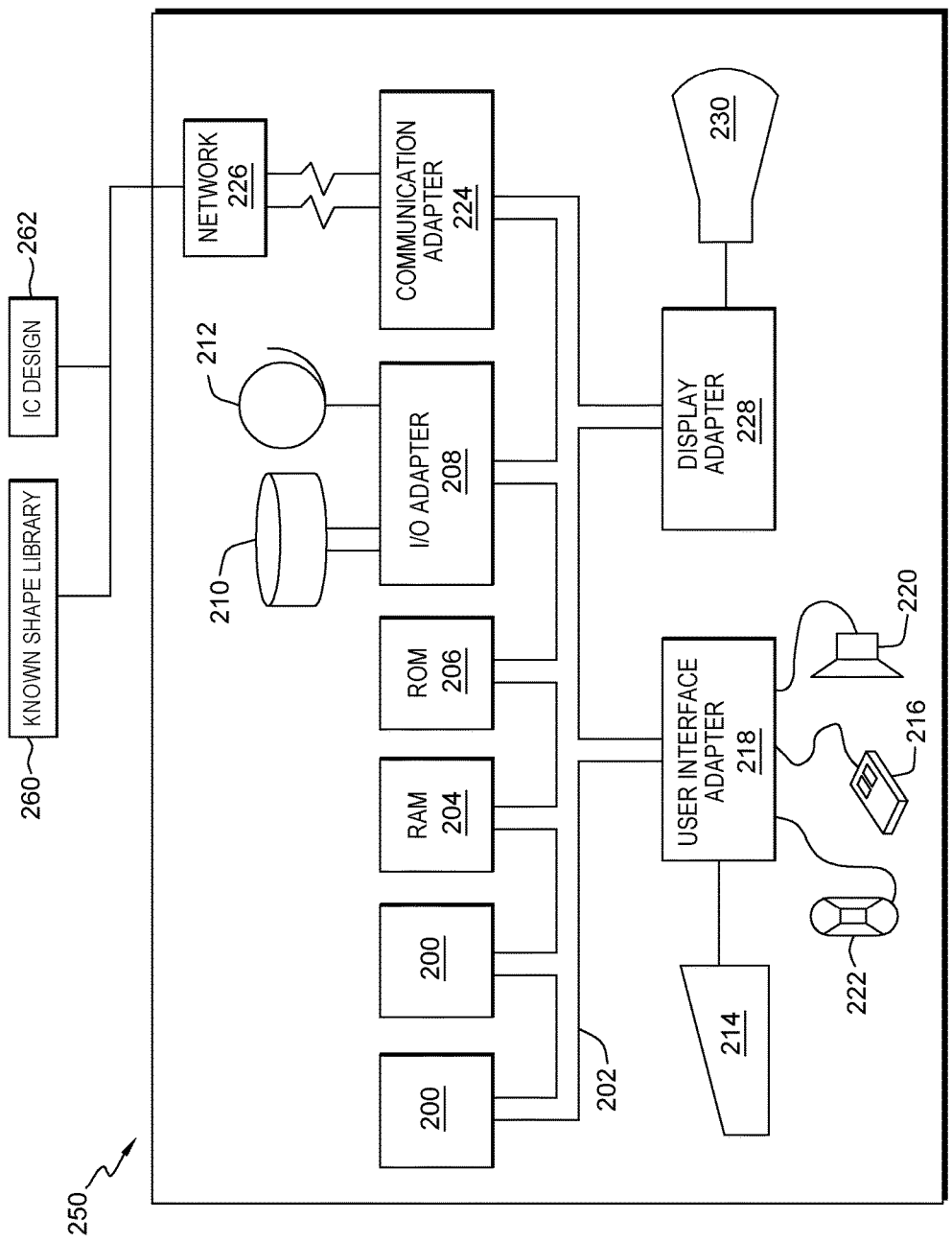
FIG. 4 is a schematic diagram of a hardware system according to embodiments herein.

FIG. 4 illustrates systems herein that can include more or less components than illustrated. Such systems include at least one processor 200, at least one input/output 208, 218, 224, 228, etc., connected to the processor 200, other components, etc. The input/output 208, 218, 224, 228, etc. receives an integrated circuit (IC) design 262. The processor 200 automatically selects a first area of the IC design 262 that has first shapes. The first shapes represent device elements of devices in the IC design 262 and known shapes represent known shapes in a library of shapes 260. The processor 200 automatically aligns a known pattern area of known shapes with the first shapes of the first area by overlaying and centering the known pattern area on the first area.

The processor 200 automatically compares the first area to the known pattern area, while the first area is overlaid on the known pattern area, to identify dissimilarities, between the first shapes in the first area and the known shapes in the known pattern area, as unweighted shapes. The unweighted shapes are maintained in a pattern difference area. More specifically, the processor 200 compares the first area to the known pattern area by performing an exclusive or (XOR) comparison of aligned portions of the first area and the known pattern area to determine if the aligned portions are different from one another. Stated differently, the processor 200 compares the first area to the known pattern area by identifying locations where portions of the first shapes in the first area and portions of the known shapes in the known pattern area are present, but do not overlap one another.

The processor 200 automatically (or the user manually) selects from among different weighting zone patterns to select the weighting zone pattern. The processor 200 automatically aligns the pattern difference area to the weighting zone pattern (by overlaying and centering the weighting zone pattern on the pattern difference area). The processor 200 thus automatically weights the unweighted shapes, based on the location of the unweighted shapes relative to the weighting zone pattern aligned with the pattern difference area, to produce weighted shapes in a pattern difference area. In more detail, the processor 200 weights the unweighted shapes by multiplying an area measure of each portion of the unweighted shapes that are within a corresponding zone of the weighting zone pattern by a weighting factor of the corresponding zone.

Further, the processor 200 automatically calculates a dissimilarity measure between the first area and the known pattern area by summing the weighted shapes in the pattern difference area. Also, the processor 200 automatically determines a match factor of how much, or whether, the first area matches the known pattern area based on the magnitude of the dissimilarity measure, and/or whether the dissimilarity measure exceeds a threshold; and the input/output 208, 218, 224, 228, etc. automatically outputs the match factor.

The representative hardware environment (i.e., a computer system 250) that implements the foregoing incorporates at least one processor or central processing unit (CPU) 200. The CPUs 200 are interconnected via a system bus 202 to various devices such as a random access memory (RAM) 204, read-only memory (ROM) 206, and an input/output (I/O) adapter 208. The I/O adapter 208 can connect to peripheral devices, such as disk units 210 and tape drives 212, or other program storage devices that are readable by the system. The system can read the inventive instructions on the program storage devices and follow these instructions to execute the methodology of the embodiments herein. The system further includes a user interface adapter 218 that connects a keyboard 214, mouse 216, speaker 220, microphone 222, and/or other user interface devices such as a touch screen device (not shown) to the bus 202 to gather user input. Additionally, a communication adapter 224 connects the bus 202 to a data processing network 226, and a display adapter 228 connects the bus 202 to a display device 230 which may be embodied as an output device such as a monitor, printer, or transmitter, for example.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
receiving an integrated circuit (IC) design;
selecting a first area of the IC design;
aligning a known pattern area having a known failure mechanism with the first area;
comparing the first area to the known pattern area to identify dissimilarities between the first area and the known pattern area as unweighted shapes in a pattern difference area;
weighting the unweighted shapes based on a location of the unweighted shapes relative to a weighting zone pattern to produce weighted shapes;
calculating a dissimilarity measure between the first area and the known pattern area by summing the weighted shapes in the pattern difference area;
determining a match factor of how much the first area matches the known pattern area based on the dissimilarity measure;
outputting the match factor; and
updating the IC design based on the match factor to avoid including the known failure mechanism in integrated circuits produced using an updated version of the IC design.

2. The method according to claim 1, further comprising selecting from among different weighting zone patterns to select the weighting zone pattern.

3. The method according to claim 1, wherein the weighting the unweighted shapes comprises multiplying an area measure of each portion of the unweighted shapes that are within a corresponding zone of the weighting zone pattern by a weighting factor of the corresponding zone.

4. The method according to claim 1, wherein the comparing the first area to the known pattern area comprises performing an exclusive or (XOR) comparison of aligned portions of the first area and the known pattern area to determine if the aligned portions are different from one another.

5. The method according to claim 1, wherein the comparing the first area to the known pattern area comprises identifying locations where portions of first shapes in the first area and portions of second shapes in the known pattern area are present, but do not overlap one another.

6. The method according to claim 5, wherein the first shapes represent device elements of devices in the IC design and the second shapes represent known shapes in a library of shapes.

7. The method according to claim 1, wherein the first area, the known pattern area, the pattern difference area, and the weighting zone pattern are approximately the same size.

8. A method comprising:
receiving an integrated circuit (IC) design into a computerized device;
automatically selecting a first area of the IC design having first shapes, using the computerized device;
automatically aligning a known pattern area of known shapes having a known failure mechanism with the first shapes of the first area by overlaying and centering the known pattern area on the first area, using the computerized device;
automatically comparing the first area to the known pattern area, while the first area is overlaid on the known pattern area, to identify dissimilarities between the first shapes in the first area and the known shapes in the known pattern area as unweighted shapes, using the computerized device, the unweighted shapes are maintained in a pattern difference area;
automatically aligning the pattern difference area to a weighting zone pattern, using the computerized device;
automatically weighting the unweighted shapes, based on a location of the unweighted shapes relative to the weighting zone pattern aligned with the pattern difference area, using the computerized device, to produce weighted shapes;
automatically calculating a dissimilarity measure between the first area and the known pattern area by summing the weighted shapes in the pattern difference area, using the computerized device;
automatically determining a match factor of whether the first area matches the known pattern area based on whether the dissimilarity measure exceeds a threshold, using the computerized device;
automatically outputting the match factor; and
updating the IC design based on the match factor to avoid including the known failure mechanism in integrated circuits produced using an updated version of the IC design.

9. The method according to claim 8, further comprising selecting from among different weighting zone patterns to select the weighting zone pattern.

10. The method according to claim 8, wherein the weighting the unweighted shapes comprises multiplying an area measure of each portion of the unweighted shapes that are within a corresponding zone of the weighting zone pattern by a weighting factor of the corresponding zone.

11. The method according to claim 8, wherein the comparing the first area to the known pattern area comprises performing an exclusive or (XOR) comparison of aligned portions of the first area and the known pattern area to determine if the aligned portions are different from one another.

12. The method according to claim 8, wherein the comparing the first area to the known pattern area comprises identifying locations where portions of the first shapes in the first area and portions of the known shapes in the known pattern area are present, but do not overlap one another.

13. The method according to claim 12, wherein the first shapes represent device elements of devices in the IC design and the known shapes represent known shapes in a library of shapes.

14. The method according to claim 8, wherein the first area, the known pattern area, the pattern difference area, and the weighting zone pattern are approximately the same size.

15. A system comprising:
a processor; and
an input/output connected to the processor,
the input/output receives an integrated circuit (IC) design,
the processor automatically selects a first area of the IC design having first shapes,
the processor automatically aligns a known pattern area of known shapes having a known failure mechanism with the first shapes of the first area by overlaying and centering the known pattern area on the first area,
the processor automatically compares the first area to the known pattern area, while the first area is overlaid on the known pattern area, to identify dissimilarities between the first shapes in the first area and the known shapes in the known pattern area as unweighted shapes,
the unweighted shapes are maintained in a pattern difference area,
the processor automatically aligns the pattern difference area to a weighting zone pattern,
the processor automatically weights the unweighted shapes, based on a location of the unweighted shapes relative to the weighting zone pattern aligned with the pattern difference area, to produce weighted shapes,
the processor automatically calculates a dissimilarity measure between the first area and the known pattern area by summing the weighted shapes in the pattern difference area,
the processor automatically determines a match factor of whether the first area matches the known pattern area based on whether the dissimilarity measure exceeds a threshold,
the input/output automatically outputs the match factor, and
the processor updates the IC design based on the match factor to avoid including the known failure mechanism in integrated circuits produced using an updated version of the IC design.

16. The system according to claim 15, wherein the processor automatically selects from among different weighting zone patterns to select the weighting zone pattern.

17. The system according to claim 15, wherein the processor weights the unweighted shapes by multiplying an area measure of each portion of the unweighted shapes that are within a corresponding zone of the weighting zone pattern by a weighting factor of the corresponding zone.

18. The system according to claim 15, wherein the processor compares the first area to the known pattern area by performing an exclusive or (XOR) comparison of aligned portions of the first area and the known pattern area to determine if the aligned portions are different from one another.

19. The system according to claim 15, wherein the processor compares the first area to the known pattern area by identifying locations where portions of the first shapes in the first area and portions of the known shapes in the known pattern area are present, but do not overlap one another.

20. The system according to claim 19, wherein the first shapes represent device elements of devices in the IC design and the known shapes represent known shapes in a library of shapes.

* * * * *